(12) United States Patent
Huang et al.

(10) Patent No.: US 8,546,871 B2
(45) Date of Patent: Oct. 1, 2013

(54) NON-VOLATILE MEMORY CELL AND FABRICATING METHOD THEREOF

(75) Inventors: Chi-Cheng Huang, Kaohsiung (TW); Ping-Chia Shih, Tainan (TW); Chih-Ming Wang, Tainan (TW); Chun-Sung Huang, Changhua County (TW); Hsiang-Chen Lee, Kaohsiung (TW); Chih-Hung Lin, Hsinchu (TW); Yau-Kae Sheu, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/177,520

(22) Filed: Jul. 6, 2011

(65) Prior Publication Data
US 2013/0009232 A1 Jan. 10, 2013

(51) Int. Cl.
*H01L 29/792* (2006.01)
(52) U.S. Cl.
USPC ............................................ 257/324; 438/257

(58) Field of Classification Search
USPC .......................................................... 257/324
See application file for complete search history.

(56) References Cited

U.S. PATENT DOCUMENTS

| | | | |
|---|---|---|---|
| 6,794,711 B2 | 9/2004 | Kang | |
| 7,049,189 B2 * | 5/2006 | Chang et al. | 438/211 |
| 7,273,786 B2 * | 9/2007 | Mikolajick | 438/270 |
| 7,294,888 B1 * | 11/2007 | Paak et al. | 257/369 |
| 7,485,533 B2 * | 2/2009 | Lee | 438/261 |
| 2009/0261401 A1 * | 10/2009 | Shih et al. | 257/324 |

* cited by examiner

*Primary Examiner* — Thao P. Le
(74) *Attorney, Agent, or Firm* — Winston Hsu; Scott Margo

(57) ABSTRACT

A non-volatile memory cell includes a substrate, two charge trapping structures, a gate oxide layer, a gate and two doping regions. The charge trapping structures are disposed on the substrate separately. The gate oxide layer is disposed on the substrate between the two charge trapping structures. The gate is disposed on the gate oxide layer and the charge trapping structures, wherein the charge trapping structures protrude from two sides of the gate. The doping regions are disposed in the substrate at two sides of the gate.

7 Claims, 5 Drawing Sheets

NON-VOLATILE MEMORY CELL AND FABRICATING METHOD THEREOF

BACKGROUND OF THE INVENTION

1. Field of the Invention

The present invention relates to a non-volatile memory cell and a fabricating method thereof, and more particularly, to a non-volatile memory cell having a charge trapping structure protruding outside the gate and a fabricating method thereof.

2. Description of the Prior Art

Semiconductor memory devices used for storing data can be divided into volatile devices and non-volatile devices. Volatile memory devices lose data stored therein when a supply voltage is interrupted, while non-volatile memory devices retain the data stored therein even if the supply voltage is interrupted. Accordingly, non-volatile memory devices are widely used when the supply voltage is not always applied or often interrupted, or when a device requires only a low voltage, such as a mobile telephone, a memory card for storing music and/or image data, and other application devices.

Cell transistors of the non-volatile memory device have a stacked gate structure. The stacked gate structure includes a gate insulating layer which is sequentially stacked on a channel region of the cell transistor, a floating gate electrode, an insulating layer between gates, and a control gate electrode. The non-volatile memory device often can be formed by a silicon layer in which a channel region is formed, an oxide layer which forms a tunneling layer, a nitride layer which is used as a charge trapping layer, an oxide layer which is used as a blocking layer, and a silicon layer which is used as a control gate electrode. This structure is referred to as a silicon-oxide-nitride-oxide-silicon (or SONOS) cell structure.

A conventional SONOS memory cell can perform forward read and reverse read to store electrons in the right side or left side of the charge trapping layer. With the shrinkage of semiconductor devices, however, the size of the charge trapping layer is reduced and the electrons stored therein are becoming fewer as well. This results in increased errors of the memory devices when programming or reading devices and thus affects the reliability of semiconductor products.

SUMMARY OF THE INVENTION

The present invention therefore provides a non-volatile memory cell and a fabricating method thereof, which can alleviate the abovementioned problem and provide better electrical performance.

According to one embodiment, a non-volatile memory cell is provided. The non-volatile memory includes a substrate, two charge trapping structures, a gate oxide layer, a gate and two doping regions. The charge trapping structures are disposed on the substrate separately. The gate dielectric layer is disposed on the substrate between two charge trapping structures. The gate is disposed on the gate dielectric layer and the charge trapping structures, wherein the charge trapping structures protrude from two sides of the gate. The doping regions are disposed in the substrate at two sides of the gate.

According to another embodiment, a non-volatile memory cell is provided. The non-volatile memory includes a substrate, two charge trapping structures, a gate dielectric layer, a gate, a spacer and two doping regions. The charge trapping structures are disposed on the substrate separately. The gate dielectric layer is disposed on the substrate between two charge trapping structures. The gate is disposed on the gate dielectric layer and the charge trapping structures. The spacer is disposed on a sidewall of the gate and on the two charge trapping structures, wherein the spacer and the charge trapping structures are co-planar. The doping regions are disposed in the substrate at two sides of the gate.

According to another embodiment, a method of fabricating a non-volatile memory cell is provided. A substrate is provided. A patterned composite layer and a gate layer are sequentially formed on the substrate. The gate layer is then patterned to form a gate. A material layer is formed on the gate and the patterned composite layer. The material layer and the patterned composite layer are then patterned such that the patterned composite layer becomes two charge trapping structures and the material layer becomes a spacer.

Since the charge trapping structure and the first spacer are formed in the same etching step, the charge trapping structures will protrude from two sides of the gate such that their size is larger than in the conventional art.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
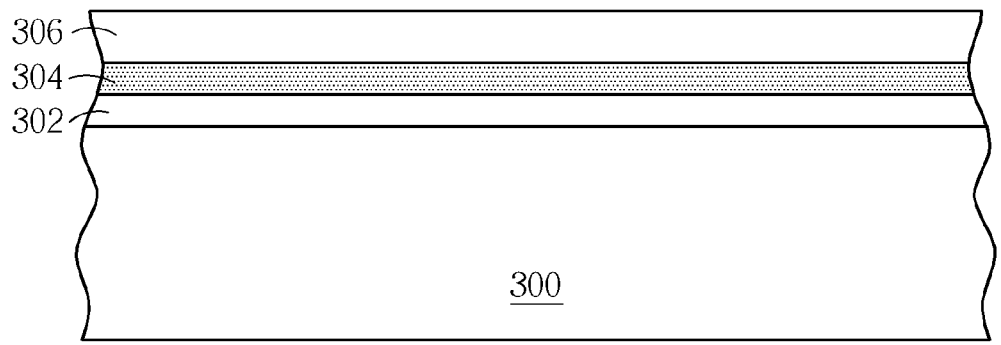
FIG. 1 to FIG. 7 illustrate schematic diagrams of the method of fabricating the non-volatile memory cell in accordance with the first embodiment of the present invention.

Please refer to FIG. 1 to FIG. 7, which illustrate schematic diagrams of the method of fabricating the non-volatile memory cell in accordance with the first embodiment of the present invention. As shown in FIG. 1, a substrate 300 is provided, such as a silicon substrate, an epitaxial silicon substrate, a silicon germanium substrate, a silicon carbide substrate or a silicon-on-insulator (SOI) substrate. Then, a first dielectric layer 302, a charge trapping layer 304 and a second dielectric layer 306 are formed sequentially on the substrate 300. In one embodiment of the present invention, the first dielectric layer 302 and the second dielectric layer 306 includes silicon oxide, while the charge trapping layer 304 includes silicon nitride, tantalum oxide, strontium titanate or hafnium oxide, but is not limited thereto. In one embodiment, the charge trapping layer 304 may include polysilicon or other suitable materials. The first dielectric layer 302, for example, can be formed on the substrate 300 by a thermal oxidation process. In another embodiment, the first dielectric layer 302 can be formed by a chemical vapor deposition (CVD) process. The charge trapping layer 304 can be formed by carrying out a nitridation process upon the first dielectric layer 302 or can be formed by a CVD process. The second dielectric layer 306 can be formed by a CVD process.

Figure 2:
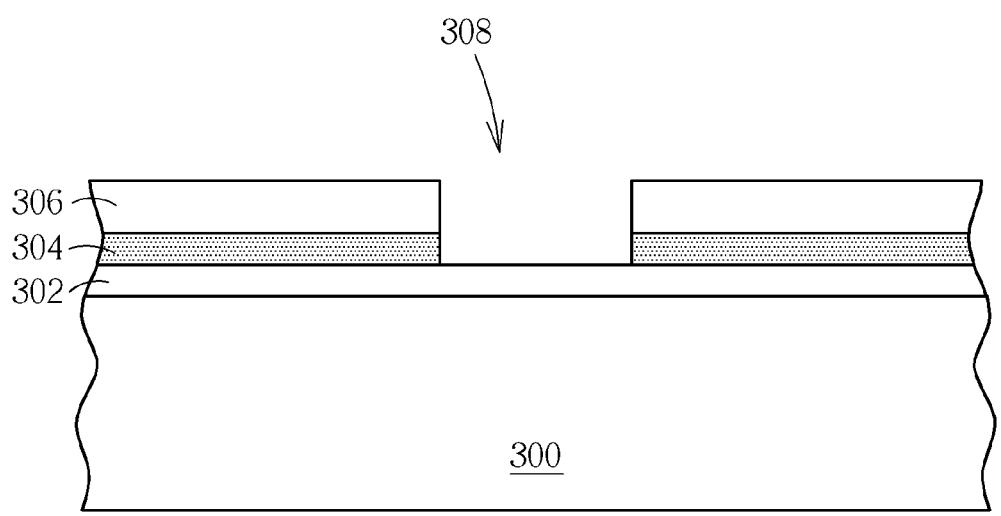

As shown in FIG. 2, the second dielectric layer 306 and charge trapping layer 304 are patterned to form a patterned composite structure having a trench 308 to expose a part of the first dielectric layer 302. For example, a patterned photoresist layer (not shown) can be formed on the second dielectric layer 306. An etching process is then performed by using the patterned photoresist layer as a mask. The etching process will move a part of the second dielectric layer 306 and the charge trapping layer 304 and stop on the first dielectric layer 302 without further etching the first dielectric layer 302.

In another embodiment, the etching process will remove the first dielectric layer 302 not covered by the patterned photoresist layer (not shown) to expose a part of the substrate 300.

Figure 3:
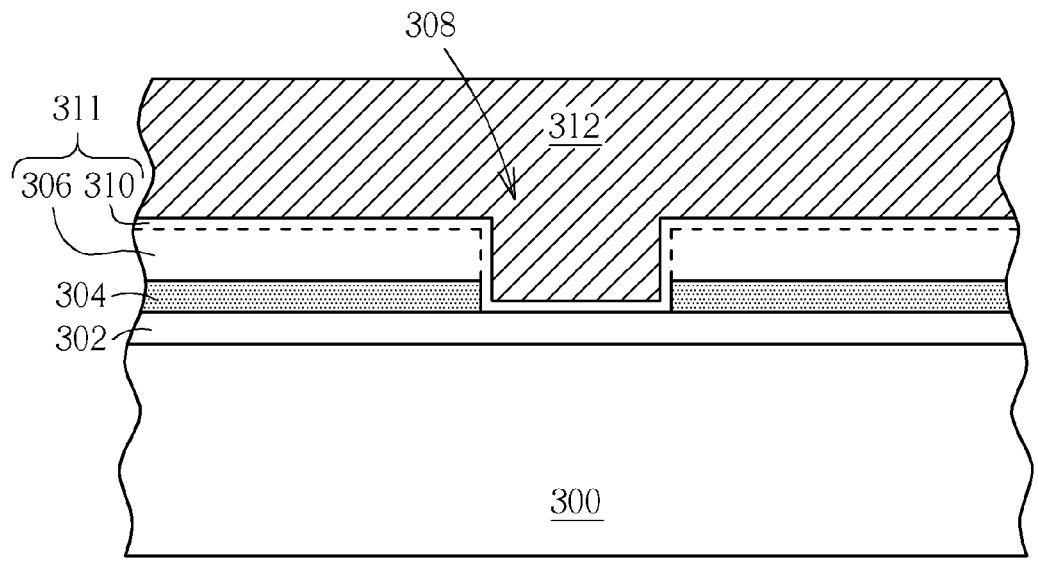

As shown in FIG. 3, a third dielectric layer 310 and a gate layer 312 are sequentially formed on the substrate 300. The third dielectric layer 310 is formed conformally in the trench 308 but does not completely fill the trench 308. The third dielectric layer 310, for example, is a silicon oxide layer and can be formed by an in-situ steam-generation (ISSG) process, thereby obtaining a thinner third dielectric layer 310 with good quality. In one preferred embodiment of the present invention, the third dielectric layer 310 and the second dielectric layer 306 contain the same material, such as silicon dioxide. After forming the third dielectric layer 310, the third dielectric layer 310 and the second dielectric layer 306 are fused together to form a fourth dielectric layer 311. The fourth dielectric layer 311 has a non-uniform thickness, wherein the thickness of the fourth dielectric layer 311 on the bottom of the trench 308 is less than that above the charge trapping layer 304. The gate layer 312 is formed on the fourth dielectric layer 311 and completely fills the trench 308. The gate layer 312 includes a variety of conductive materials, such as polysilicon or metal, and can be formed by a low pressure CVD (LPCVD), for example.

Figure 4:
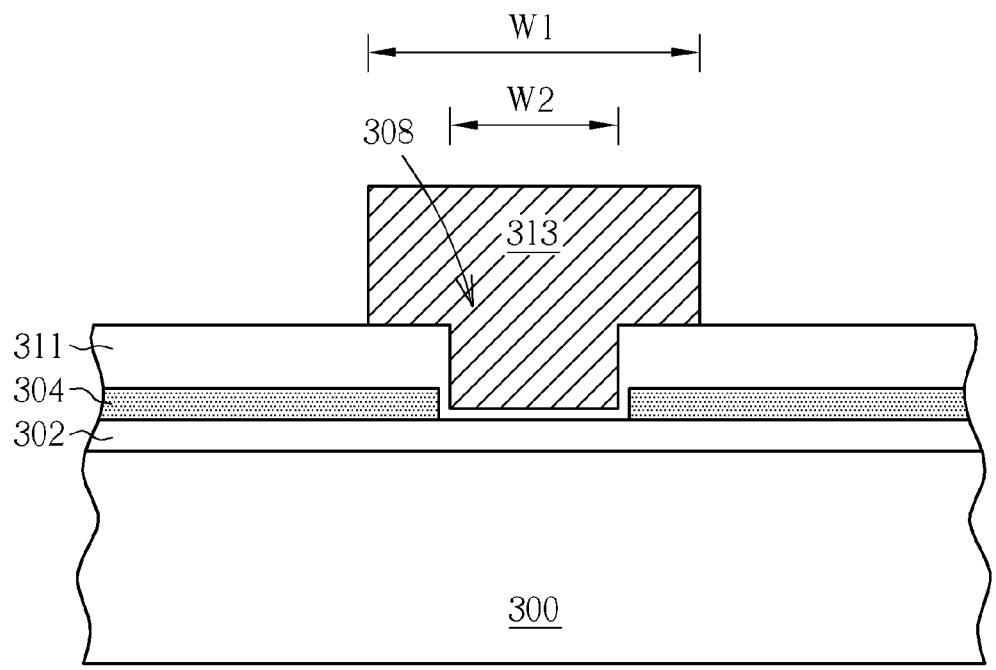

As shown in FIG. 4, the gate layer 312 is patterned to form a gate 313. The width W1 of the gate 313 is greater than the width W2 of the trench 308 such that a part of the gate 313 is located on the fourth dielectric layer 311 and the charge trapping layer 304. It is noted that, the etching step generally removes the gate layer 312 while a small portion of the fourth dielectric layer 311 would be removed due to the etching selectivity. However, the charge trapping layer 304 and the first dielectric layer 302 are not patterned in this etching step.

Figure 5:
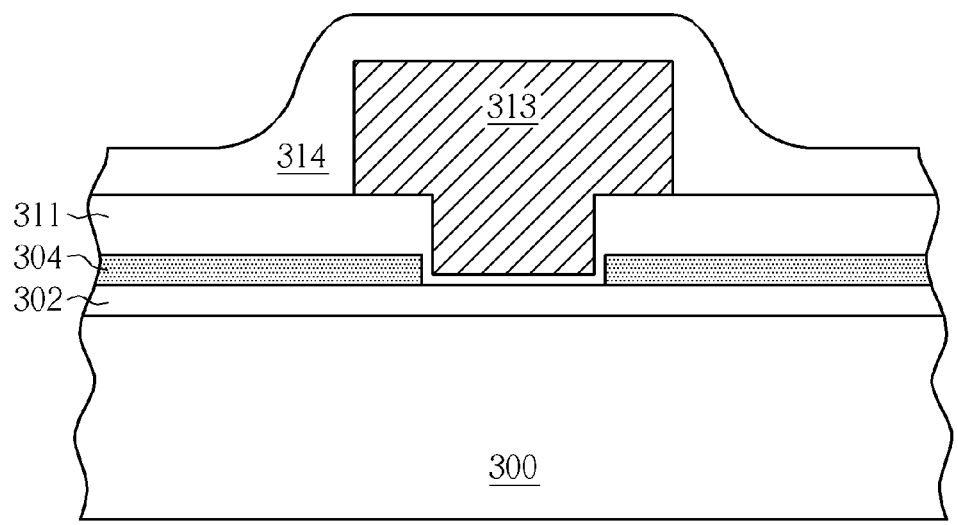

As shown in FIG. 5, a material layer 314 is formed on the substrate 300 to cover the gate 313 and the fourth dielectric layer 311. In one embodiment, the material layer 314 includes silicon dioxide, silicon nitride or silicon oxynitride, but is not limited thereto.

Figure 6:
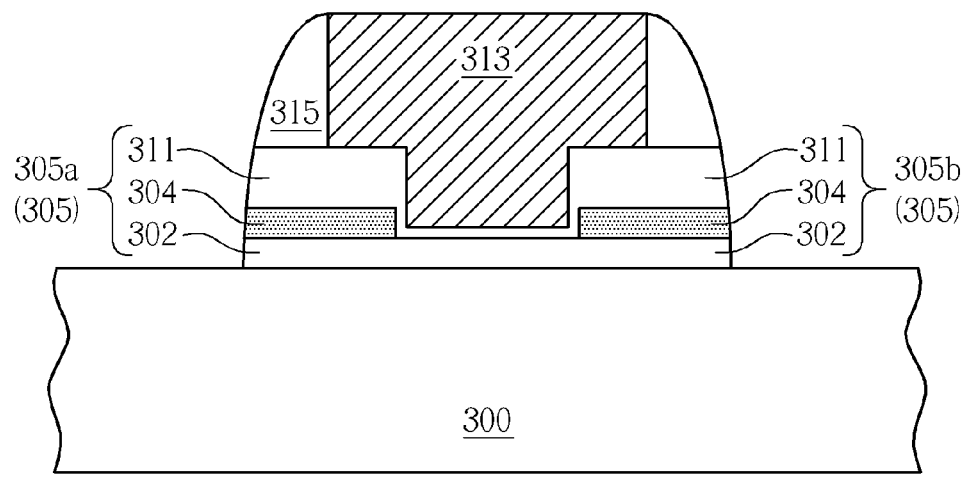

As shown in FIG. 6, at least an anisotropic etching process is performed to simultaneously form a first spacer 315 and two charge trapping structures 305. For example, a dry etching process is performed to etch the material layer 314, the fourth dielectric layer 311, the charge trapping layer 304 and the first dielectric layer 302 at two sides of the gate 313. The material layer 314 remained on the fourth dielectric layer 311 therefore becomes a first spacer 315, and the fourth dielectric layer 311, the charge trapping layer 304 and the first dielectric layer 302 after the etching process become two charge trapping structures 305a, 305b, which are located at two respective sides of the gate 313.

Figure 7:
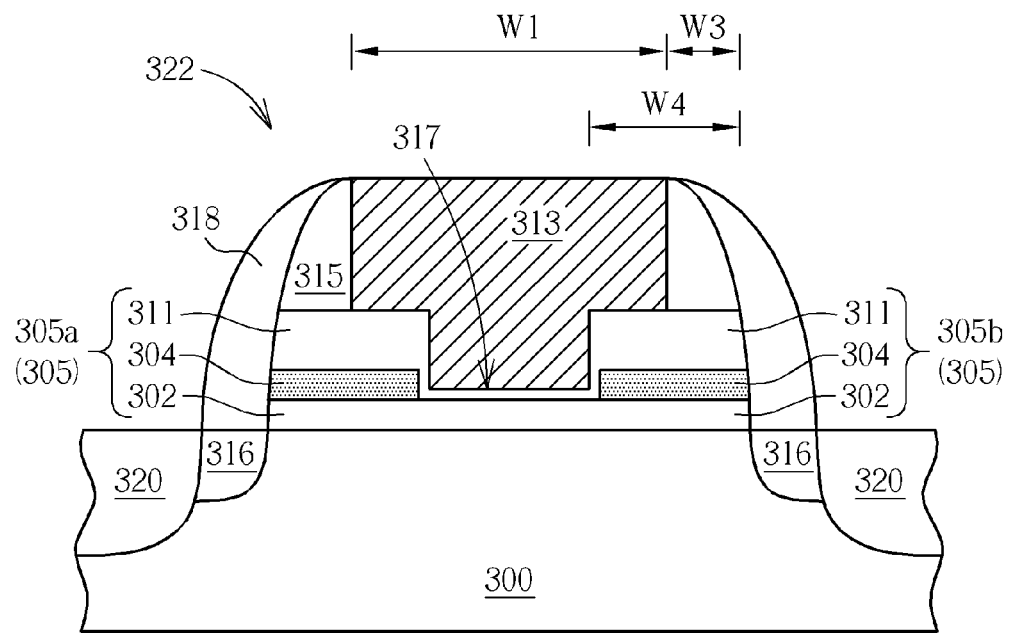

As shown in FIG. 7, an ion implantation process is performed by using the gate 313, the first spacer 315 and the charge trapping structures 305 as a mask to form a light doping region 316 in the substrate 300. Next, a second spacer 318 is formed on a sidewall of the first spacer 315 and the charge trapping structure 305. Another ion implantation process is performed by using the gate 313 and the second spacer 318 as a mask to form a source/drain region 320 in the substrate 300. Thereafter, a non-volatile memory cell 322 in the present invention is obtained.

As shown in FIG. 7, the non-volatile memory cell 322 in the present invention includes at least a substrate 300, two charge trapping structures 305a and 305b, a gate dielectric layer 317, a gate 313, a first spacer 315 and a source/drain region 320. The charge trapping structures 305a, 305b are disposed on the substrate 300 separately. Each charge trapping structure 305 includes an oxide/nitride/oxide (ONO) stack structure. For example, the charge trapping structure 305a includes an ONO stack structure containing a part of the first dielectric layer 302, the left charge trapping layer 304 and a part of the fourth dielectric layer 311, while the charge trapping structure 305b includes an ONO stack structure containing a part of the first dielectric layer 302, the right charge trapping layer 304 and a part of the fourth dielectric layer 311. The gate dielectric layer 317 is disposed on the substrate 300 and is located between the two charge trapping structures 305a and 305b. The gate dielectric layer 317 is located between the gate 313 and the substrate 300 and is composed of a part of the fourth dielectric layer 317 and a part of the first dielectric layer 302. The gate 313 is disposed on the gate dielectric layer 317 and a part of the charge trapping structures 305a, 305b. The first spacer 315 is disposed on a sidewall of the gate 313 and is located on the charge trapping structure 305. The source/drain region 320 is disposed in the substrate 300 at two sides of the gate 313.

Since the charge trapping structure 305 in the present invention is not formed with the gate 313, but is formed with the first spacer 315 (see FIG. 6), the charge trapping structure 305 is co-planar with the first spacer 315 and protrudes from two sides of the gate 313. Compared to a conventional charge trapping structure which is co-planar with the gate, the charge trapping structure 305 in the present invention has a larger width and volume. When the non-volatile memory cell 322 is programmed, the charge trapping structure 305 can capture more electrons and therefore prevent the electrons from being captured by the first spacer 315 or the second spacer 318, which enhances the quality of the product. In one embodiment of the present invention, the width W1 of the gate 313 is about 220 nm, the width W3 of the first spacer 315 is about 15 nm, and the width W4 of the charge trapping structure 305 is about 30 nm.

It is noteworthy that, in the above fabricating method in FIG. 2, if the first dielectric layer 302 not covered by the patterned photoresist is removed by the etching process to expose the substrate 300, another embodiment of the non-volatile memory cell 322 can be obtained. In the present embodiment, the gate dielectric layer 317 is only composed of the thin fourth dielectric layer 311. In comparison with the embodiment in FIG. 7, the gate dielectric layer 317 is thinner, thereby reducing the driving voltage of the device.

Figure 8:
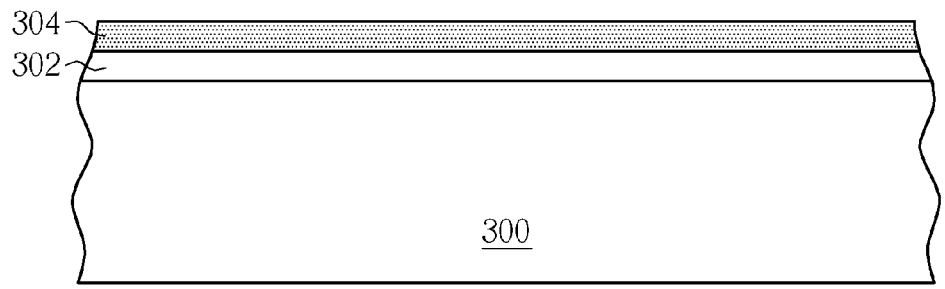
FIG. 8 to FIG. 10 illustrate schematic diagrams of the method of fabricating the non-volatile memory cell in accordance with the second embodiment of the present invention.
Figure 9:
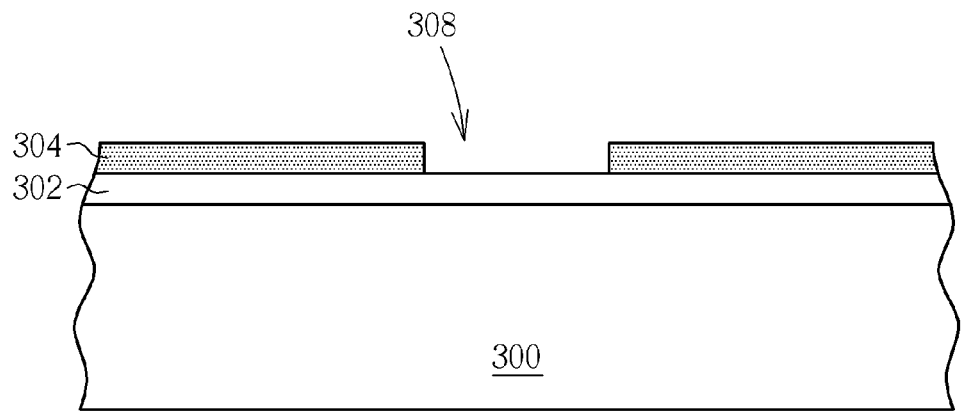
Figure 10:
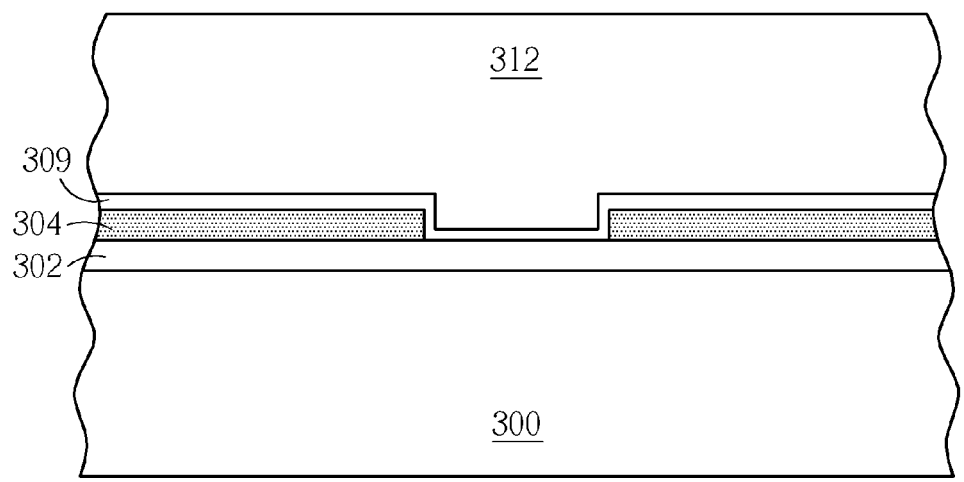

Please refer to FIG. 8 to FIG. 10, which illustrate schematic diagrams of the non-volatile memory cell in accordance with the second embodiment of the present invention. As shown in FIG. 8, a substrate 300 is provided. A first dielectric layer 302 and a charge trapping layer 304 are formed on the substrate 300. Detailed descriptions of the substrate 300, the first dielectric layer 302 and the charge trapping layer 304 are similar to those in the first embodiment and therefore not repeated. As shown in FIG. 9, the charge trapping layer 304 is patterned to form a patterned composite layer including a trench 308 to expose a part of the first dielectric layer 302. As shown in FIG. 10, a fifth dielectric layer 309 is formed on the substrate 300. The fifth dielectric layer 309 covers the charge trapping layer 304 and the trench 308. Next, the gate layer 312 is formed on the fifth dielectric layer 309, forming a structure similar to FIG. 3. Subsequently, the processes shown in FIG. 4 to FIG. 7 can be continued. In another embodiment, in the etching process in FIG. 9, a part of the first dielectric layer 302 can be removed to expose the substrate 300, thereby forming a non-volatile memory cell 322 with a thinner gate dielectric layer 317 in the subsequent steps.

In light of the above, the present provides a non-volatile memory cell and a fabricating method thereof. Since the charge trapping structure and the first spacer are formed in the same etching step, the charge trapping structures will protrude from two sides of the gate and have a larger size than the conventional structures. Further, the method of fabricating the non-volatile memory cell provided in the present invention is compatible with existing metal-oxide semiconductor (MOS) fabricating methods. For example, from the step in FIG. 3, the following steps in FIG. 4 to FIG. 7 can be integrated into an existing MOS fabricating method. Only one additional lithography process is required in the present invention to form the non-volatile memory cell. Both time and cost can be streamlined and products with good performance can be provided.

Those skilled in the art will readily observe that numerous modifications and alterations of the device and method may be made while retaining the teachings of the invention.

What is claimed is:

1. A non-volatile memory cell, comprising:
   a substrate;
   two charge trapping structures separately disposed on the substrate;
   a gate dielectric layer disposed on the substrate and between the two charge trapping structures;
   a gate electrode disposed on the gate dielectric layer and the charge trapping structures, wherein the two charge trapping structure protrude from two sides of the gate electrode;
   at least a first spacer disposed on the charge trapping structure, wherein the first spacer has a vertical sidewall and a curved sidewall, and the vertical sidewall is perpendicular to the substrate and in direct contact with the gate electrode, and the curved sidewall does not contact with the gate electrode;
   a second spacer disposed on the curved sidewall of the first spacer and a sidewall of the charge trapping structure; and
   two doping regions disposed in the substrate at two sides of the gate electrode.

2. The non-volatile memory cell according to claim 1, wherein the charge trapping structure comprises an ONO structure.

3. The non-volatile memory cell according to claim 1, wherein the first spacer and the charge trapping structures are co-planar.

4. A non-volatile memory cell, comprising:
   a substrate;
   two charge trapping structures separately disposed on the substrate;
   a gate dielectric layer disposed on the substrate and between the two charge trapping structures;
   a gate disposed on the gate dielectric layer and the charge trapping structures;
   at least a first spacer disposed on a sidewall of the gate and only on a top surface of the charge trapping structures, wherein the first spacer and the charge trapping structures are co-planar; and
   two doping regions disposed in the substrate at two sides of the gate.

5. The non-volatile memory cell according to claim 4, wherein the charge trapping structure comprises an ONO structure.

6. The non-volatile memory cell according to claim 4, wherein the two charge trapping structure protrude from two sides of the gate electrode.

7. The non-volatile memory cell according to claim 4, further comprising a second spacer disposed on a sidewall of the first spacer and the charge trapping structures.

* * * * *